US011039518B2

United States Patent
Blanchard (10) Patent No.: US 11,039,518 B2
(45) Date of Patent: Jun. 15, 2021

(54) METHOD FOR LED FAULT DETECTION AND MECHANISM HAVING LED FAULT DETECTION

(71) Applicant: MTD PRODUCTS INC, Valley City, OH (US)

(72) Inventor: Edward John Blanchard, Carmel, IN (US)

(73) Assignee: MTD PRODUCTS INC, Valley City, OH (US)

(*) Notice: Subject to any disclaimer, the term of this patent is extended or adjusted under 35 U.S.C. 154(b) by 0 days.

(21) Appl. No.: 16/712,001

(22) Filed: Dec. 12, 2019

(65) Prior Publication Data

US 2020/0196420 A1 Jun. 18, 2020

Related U.S. Application Data

(60) Provisional application No. 62/781,279, filed on Dec. 18, 2018.

(51) Int. Cl.
*H05B 45/10* (2020.01)
*H05B 45/44* (2020.01)
(Continued)

(52) U.S. Cl.
CPC ......... *H05B 45/54* (2020.01); *G01R 31/2635* (2013.01)

(58) Field of Classification Search
CPC ............... H05B 33/08; H05B 33/0815; H05B 33/0827; H05B 33/0845; H05B 33/0857;
(Continued)

(56) References Cited

U.S. PATENT DOCUMENTS

| 6,888,454 B2* | 5/2005 | Kurose | G09G 3/006 340/514 |
| 2005/0218837 A1* | 10/2005 | Zipf | H05B 45/46 315/291 |

(Continued)

FOREIGN PATENT DOCUMENTS

| EP | 2487999 A1 | 8/2012 |
| WO | 20120077013 A2 | 6/2012 |

OTHER PUBLICATIONS

International Search Report and Written Opinion issued in International Application No. PCT/US2019/065921 dated Mar. 6, 2020; 12 pages.

*Primary Examiner* — Thai Pham
(74) *Attorney, Agent, or Firm* — Wegman Hessler (57) ABSTRACT

An illumination mechanism includes a plurality of LEDs for illuminating a surface and is configured to determine whether one of the plurality of LEDs has faulted. A pair of LED sets is provided with the sets electrically connected in parallel via terminal connections of each set of LEDs. Regardless of at least one of environmental temperature or minor differences in minimum forward voltages of individual LEDs, the mechanism is configured to discern whether at least a single LED of one set of LEDs of the pair has faulted. In instances where the sets of LEDs are separated from a controller or voltage measurement circuitry, the cost, circuit board real estate consumption, and manufacturing complexity associated with additional wiring and connections are minimized.

17 Claims, 3 Drawing Sheets

(51) Int. Cl.
*H05B 45/50* (2020.01)
*H05B 45/54* (2020.01)
*G01R 31/26* (2020.01)

(58) Field of Classification Search
CPC ...... H05B 33/089; H05B 45/10; H05B 45/46; H05B 45/48; H05B 45/52; H05B 45/22; H05B 45/50; H05B 45/54; H05B 47/20; H05B 47/21
See application file for complete search history.

(56) References Cited

U.S. PATENT DOCUMENTS

| | | | |
|---|---|---|---|
| 2006/0223637 A1* | 10/2006 | Rosenberg | A63F 13/65 463/47 |
| 2007/0139317 A1* | 6/2007 | Martel | H05B 45/37 345/82 |
| 2007/0159750 A1* | 7/2007 | Peker | H05B 47/20 361/93.1 |
| 2008/0122383 A1* | 5/2008 | Katoh | G09G 3/14 315/291 |
| 2012/0074856 A1* | 3/2012 | Takata | H05B 45/37 315/192 |
| 2012/0200296 A1* | 8/2012 | Avenel | H05B 45/50 324/414 |
| 2012/0206146 A1* | 8/2012 | Avenel | H05B 45/50 324/414 |
| 2013/0119861 A1* | 5/2013 | Vollmer | H05B 45/10 315/77 |

* cited by examiner

FIG. 3

METHOD FOR LED FAULT DETECTION AND MECHANISM HAVING LED FAULT DETECTION

CROSS REFERENCE TO RELATED APPLICATIONS

This application claims the benefit of U.S. Provisional Application No. 62/781,279, filed Dec. 18, 2018, the entire disclosure of which is incorporated herein by reference.

FIELD OF INVENTION

The disclosed technology relates generally to detection of a faulted light-emitting diode (LED) of a plurality of LEDs, and more particularly to a mechanism having a plurality of LEDs for illuminating a surface and having the capability of determining whether one of the plurality of LEDs has faulted.

BACKGROUND

LED based lighting is utilized in a wide array of lighting applications, often with a plurality of LEDs provided in a string. LED strings often are used provide lighting for critical components, such as the back lighting of a television screen or the surface illumination for a sensor or a camera. Failure of one or more LEDs in such a string can lead to subsequent issues with the product being lit, such as unbalanced or wrongly colored lighting where different color LEDs are utilized. Such failure can be difficult to visually recognize where the LED string is hidden or not easily accessible. Failure also can be difficult to discern due to the effect of varying temperature on the LED string or due to minor variations in forward voltages of varying LEDs of the LED string, which aspects may result in a decrease or increase in voltage at a terminal end of the LED string that is difficult to recognize as a respective decrease or increase in voltage as caused by a failed LED.

SUMMARY OF INVENTION

The disclosed technology provides an illumination mechanism having a plurality of LEDs for illuminating a surface and having the capability of determining whether one of the plurality of LEDs has faulted while accounting for environment temperature fluctuations and inherent varying forward voltages of same-type LEDs caused by manufacturing. A pair of LED sets is provided, with the sets electrically connected in parallel, such that voltages of the pair of LED sets may be compared to determine whether a difference is representative of a fault of an LED in one of the LED sets of the pair. In some embodiments, connections between the sets may be provided only at terminal connections of each set, such that single LEDs of one set are not otherwise connected to single LEDs of the other set other than via the terminal connections.

The arrangement of the pair of LED sets addresses one or more of the aforementioned issues relating to LED failure. Regardless of at least one of environmental temperature or minor differences in construction of individual LEDs, the mechanism is configured to discern whether at least a single LED of one LED set of the pair has faulted open or closed, by comparison to the other LED set of the pair, which other set does not include the faulted LED. This arrangement has the benefit over more complex arrangements, such as multiplexing of a single LED set.

The arrangement is capable of accounting for the varying environmental temperatures or the varying forward voltages of same-type LEDs which otherwise would require an in-depth understanding of what are often off-the-shelf LEDs having changing tolerances and for which such information is not available. The minimal connections between the two sets further allows for a less complicated and costly circuit. Such configuration is effective in instances where the LED sets are separated from a measurement circuit and/or controller, minimizing the cost, circuit board real estate consumption, and manufacturing complexity associated with additional wiring and connections.

According to one aspect of the disclosed technology, an illumination mechanism includes a first set of LEDs and a second set of LEDs electrically connected in parallel to one another via terminal connections of each of the first and second sets of LEDs, a power source arranged to power the first and second sets of LEDs, a voltage measuring circuitry arranged to separately measure a voltage at each of the first and second sets of LEDs, and a control circuitry in communication with the voltage measuring circuitry. The control circuitry is configured to compare against one another the voltages measured at each of the first and second sets of LEDs and to output a fault indicator where a difference is discerned between the measured voltages.

Between the respective terminal connections of the first set of LEDs, each individual LED of the first set of LEDs may be electrically separated from each individual LED of the second set of LEDs disposed between the respective terminal connections of the second set of LEDs and vice versa.

Each of the first and second sets of LEDs can have both a cathode terminal connection and an anode terminal connection, and the voltage measuring circuitry can be arranged to measure the voltage at the same of the cathode terminal connection or the anode terminal connection of each of the first and second sets of LEDs.

The voltage that the voltage measuring circuitry is arranged to separately measure at each of the first and second sets of LEDs can be the voltage drop across each of the first and second sets of LEDs.

The voltage measuring circuitry can be configured to simultaneously measure the separate voltages at each of the first and second sets of LEDs.

The control circuitry can be configured to output a fault indicator where the difference is discerned as being at least one of less than a minimum predetermined voltage threshold or greater than a maximum predetermined voltage threshold.

The control circuitry can be configured to output the fault indicator where an absolute value of the difference is discerned as being greater than a predetermined voltage threshold.

The fault indicator can be a signal output to a display device of the illumination mechanism.

The control circuitry can be configured to further separately compare each of the voltages measured against at least one of a minimum predetermined voltage threshold or a maximum predetermined voltage threshold and to output a fault indicator indicating at least one of the first or the second sets of LEDs as having faulted.

Each of the first and the second sets of LEDs can include a same number of LEDs.

Each of the LEDs of the first set of LEDs can be serially connected to one another, and each of the LEDs of the second set of LEDs can be serially connected to one another.

According to another aspect of the disclosed technology, an illumination mechanism includes a pair of sets of LEDs each including a same number of connected LEDs, the sets of LEDs of the pair being electrically connected in a parallel and non-multiplexed arrangement to one another. The illumination mechanism further includes a power source arranged to power the first and second sets of LEDs, a voltage measuring circuitry arranged to separately measure a voltage at each of the sets of LEDs, and a control circuitry in communication with the voltage measuring circuitry and configured to compare against one another the voltages measured at each of the sets of LEDs and to output a fault indicator where a difference is discerned between the voltages measured.

Each of the sets of LEDs can have both a cathode terminal connection and an anode terminal connection, and the voltage measuring circuitry can be arranged to measure the voltage at the same of the cathode terminal connection or the anode terminal connection of each of the sets of LEDs.

The voltage that the voltage measuring circuitry is arranged to separately measure at each of the sets of LEDs can be the voltage drop across each of the sets of LEDs.

The voltage measuring circuitry can be configured to simultaneously measure the separate voltages at each of the sets of LEDs.

Each of the LEDs of the each respective set of LEDs can be serially connected to one another.

According to yet another aspect of the disclosed technology, a method of recognizing a faulted LED of an LED mechanism illuminating a surface includes (a) illuminating a surface with a pair of sets of LEDs each including a same number of connected LEDs, with the sets being electrically connected in parallel at terminal connections of each of the sets of LEDs in an arrangement preventing current from passing between the sets of LEDs physically disposed between the terminal connections; (b) powering the sets of LEDs; (c) separately measuring a voltage at each of the sets of LEDs; (d) comparing against one another the voltages measured at each of the sets of LEDs; and (e) outputting a fault indicator where a difference is discerned between the voltages measured.

The method further can include comparing the difference between the voltages measured against at least one of a minimum predetermined voltage threshold or a maximum predetermined voltage threshold and outputting a fault indicator wherein the difference is less than the minimum predetermined voltage threshold or greater than the maximum predetermined voltage threshold.

The method further can include outputting a fault indicator where an absolute value of the difference is discerned as being greater than a maximum predetermined voltage threshold.

The foregoing and other features of the disclosed technology are hereinafter described in greater detail with reference to the accompanying drawings.

BRIEF DESCRIPTION OF THE DRAWINGS

The annexed drawings, which are not necessarily to scale, show various aspects of the disclosure.

DETAILED DESCRIPTION

The principles of the present disclosure have general application to detection of a faulted LED of a plurality of LEDs. The principles have more particular application to a mechanism having a plurality of LEDs for illuminating a surface and further having the capability of determining whether at least one of the plurality of LEDs has faulted over a range of environmental temperatures and taking into account an inherent varying forward voltage range of varying LEDs of the same type or same manufacturer.

Generally, an illumination mechanism according to the disclosed technology includes a plurality of LEDs for illuminating the surface. Circuitry of the illumination mechanism is configured such that it can be discerned electronically rather than directly visually (viewing the LED) whether an LED of the plurality of LEDs has faulted, such as faulting open or closed.

By providing LED sets each having a plurality of LEDs, the need to account for differences in inherent varying forward voltages of individual LEDs is reduced or altogether eliminated where the circuitry of the illumination mechanism is arranged to examine a voltage of a set, and not to examine voltages of individual LEDs. Thus, differences in inherent varying forward voltages are averaged out by use of a plurality of LEDs per set.

Likewise, variances in forward voltages due to environmental temperature changes are negated via comparison of voltages of the LED sets where arranged in parallel with one another. This arrangement provides benefits over circuitry not providing comparison of LED sets, regardless of whether multiplexing is utilized, by discounting the need to understand the effect of environmental temperature on the voltage/current flow of any individual LED or non-compared LED set.

The circuitry also is arranged in a manner that provides a minimum of wiring and connections, and thus allows for minimal manufacturing effort, cost and circuit board real estate consumption. For example, where the plurality of LEDs are separated from a respective measurement circuit or controller and/or where the plurality of LEDs are in location that is difficult or not possible to access either visually or manually, such benefits are particularly relevant.

While the illumination mechanism is described below with reference to an autonomously driven vehicle, the illumination mechanism can have application with optical systems, such as with sensor or photographing systems. For example, the illumination mechanism can be used for illumination absent a lens, or for backlighting a surface, screen, monitor, etc.

Figure 1:
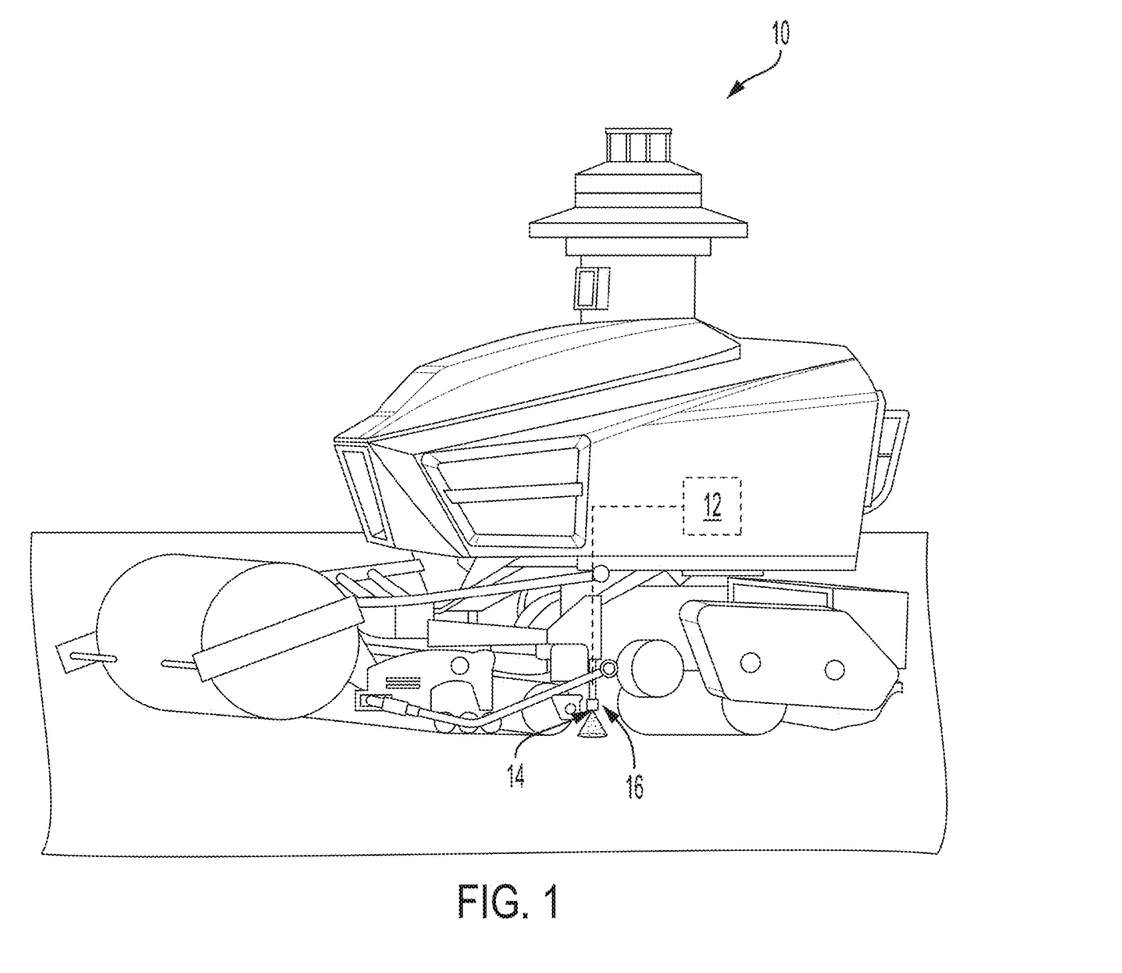
FIG. 1 is a perspective view of an autonomous mower including an illumination mechanism in accordance with the disclosed technology.

Turning first to FIG. 1, an autonomously guided apparatus, and specifically an autonomously guided vehicle, is illustrated at 10. The vehicle 10 is autonomously guided using a control system 12 that communicates with a ground-facing optical element 14, such as a camera or sensor. In one embodiment, the optical element 14 includes both a sensor and a camera. Communication between the control system 10 and the optical element 14 can be by wire or can be wireless.

The illustrated vehicle 10 is an autonomously guided mowing vehicle, which utilizes the control system 12 to aid in recognizing obstacles and/or boundaries of an area to be serviced, such as mowed or otherwise maintained. The optical element 14 of the illustrated vehicle 10 is provided for optically acquiring surface images or frames, which are utilized by the control system 12 for directing movement of the vehicle 10, such as for determining a direction and magnitude of movement of the vehicle 10.

An illumination mechanism 16 is provided with the optical element 14 for illuminating the area to be visualized or imaged, which in the case of the vehicle 10, is the ground. For instance, the vehicle 10 can use the illumination mechanism 16, optical element 14 and control system 12 in the mowing of a bounded area, such as a green at a golf course. In such embodiment, surface images or frames acquired with the optical element 14 and illumination mechanism 16 can be used to direct movement of the vehicle 10. Alternatively, or additionally, the images or frames can be used to recognize the edge of the area to be mowed for effecting a turning of the vehicle 10, such as in a manner that maintains a cutting apparatus (not shown) of the vehicle 10 over the area to be mowed.

In an embodiment, the optical element 14 can include an active optical sensor that measures relative motion of the vehicle 10. In general, conventional optical sensors include a light source, e.g. light-emitting diodes (LEDS), disposed in a lower part of the sensor that illuminate a plane below where the optical sensor assembly is positioned. Light is reflected by the plane and focused on a lens of the sensor. The focused light is converted into an electrical signal. The electrical signal corresponding to the image data of the illuminated portion of the plane can be processed by a digital signal processor to determine the moving direction and distance traveled of the optical sensor.

One or more optical odometry modules, including an optical sensor assembly, can be utilized for autonomous device navigation, and can be mounted on a chassis of the autonomous device or vehicle 10 facing downward in close proximity to the ground. The optical odometry modules incorporate optical sensors, for example, for measuring the distance and direction traveled by the autonomous device. Data obtained from the optical odometry modules can be combined with other absolute or local positioning data to determine a position and heading of the autonomous device.

Figure 2:
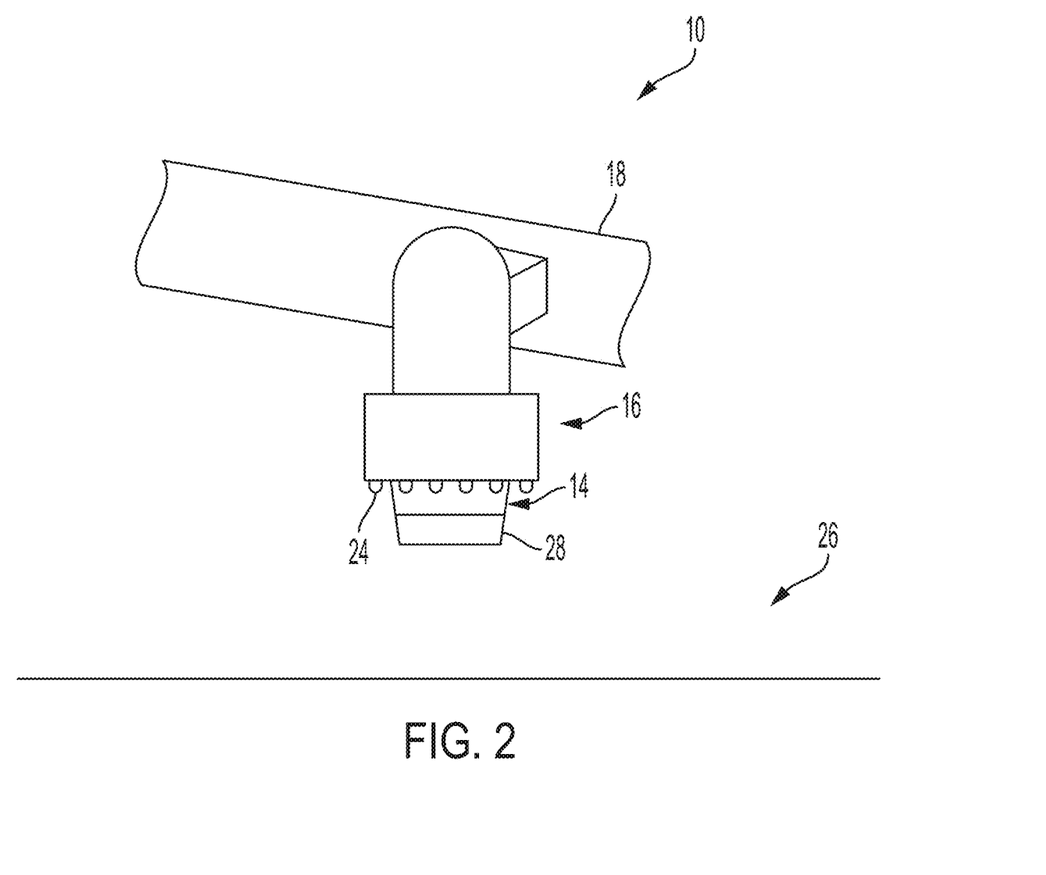
FIG. 2 is a schematic partial illustration of the autonomous mower of FIG. 1, illustrating the illumination mechanism.

Turning now to FIG. 2, a portion of the vehicle 10 is schematically shown to illustrate aspects of the vehicle 10. The optical element 14 and illumination mechanism 16 each are coupled to a portion of the vehicle 10, such as a body element 18 of the vehicle 10. The illumination mechanism 16 includes a plurality of LEDs 24 that, in the illustrated embodiment, are vertically, downwardly directed to allow for illumination of the ground or surface 26 to be mowed. The plurality of LEDs 24 are disposed about a lens 28 of the optical element 14 to allow for relatively equal lighting circumferentially about the lens 28.

Figure 3:
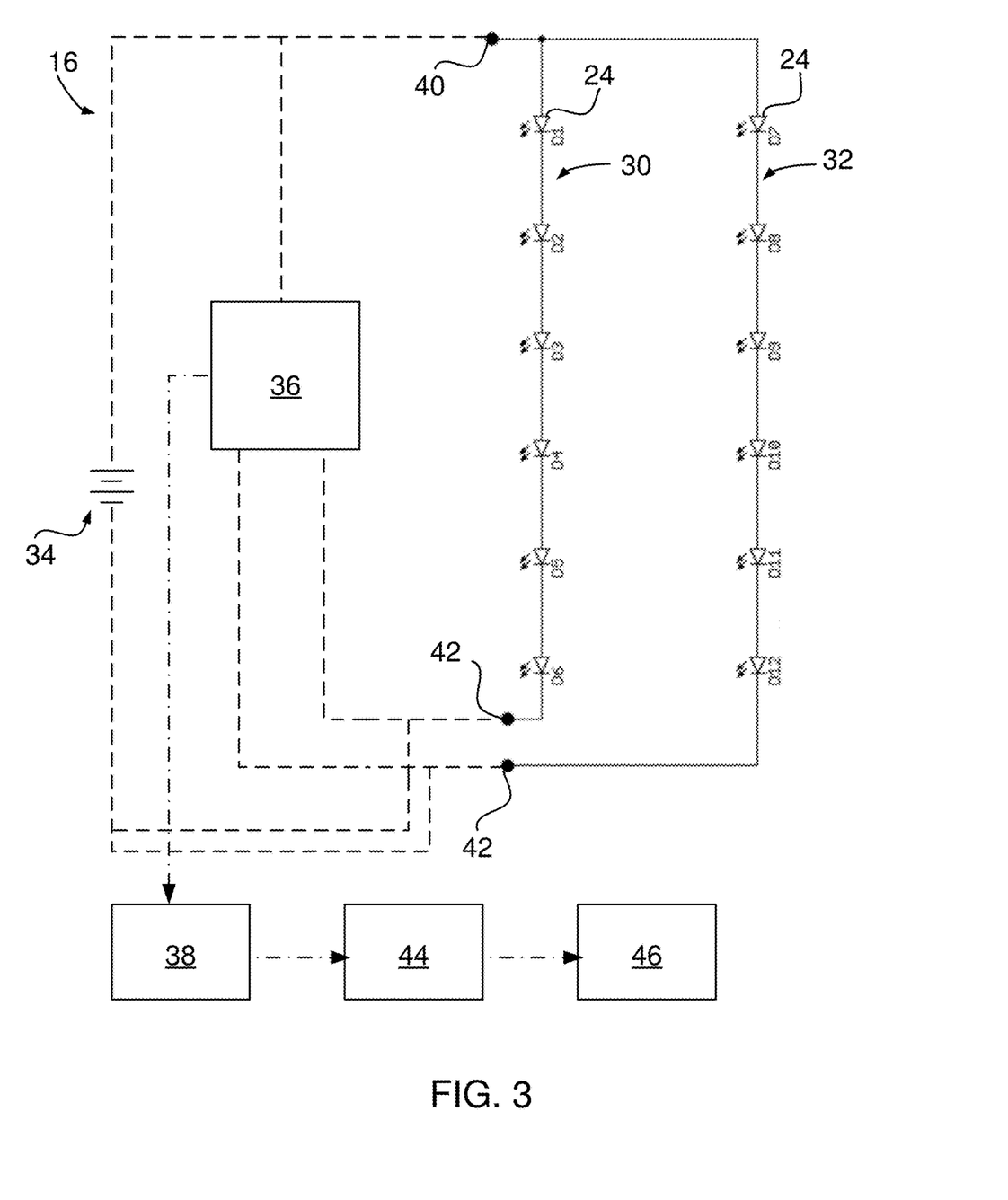
FIG. 3 is a high level schematic diagram of the illumination mechanism of FIG. 2.

Referring next to FIG. 3, a high level schematic diagram of the illumination mechanism 16 is illustrated. As shown, the illumination mechanism 16 includes a first set of LEDs 30, and second set of LEDs 32, a power source 34, a voltage measuring circuitry 36 and a control circuitry 38. These elements are connected and arranged to enable illumination of a surface and determination of a fault of at least one LED 24 of one of the sets 30, 32 of LEDs (first and second sets 30 and 32 of LEDs). While the connections of the power source 34, voltage measuring circuitry 36 and control circuitry 38 are shown in one manner in FIG. 3, alternative connection arrangements can be suitable.

The power source 34 for providing power to the first set 30 and the second set 32 can be any suitable source, such as a battery, generator, etc., providing suitable DC power or AC power, and any necessary conversion elements.

Generally, the first set 30 and the second set 32 each include a plurality of LEDs 24, with each of the first set 30 and the second set 32 being an electrical copy of the other of the first set 30 or the second set 32. For example, the LEDs 24 of each of the first set 30 and the second set 32 include the same number of LEDs 24 and the same number of each type of LED 24 where multiple types are utilized in some embodiments. Each of the first set 30 and the second set 32 are identically electrically arranged, having the same electrical circuit or portion of electrical circuit. These aspects are provided to enable efficient comparison between the first set 30 and the second set 32, such as with respect to a voltage or current at each of the first set 30 and the second set 32.

As illustrated, the first set 30 of LEDs 24 includes a plurality of LEDs 24 connected to one another, which connection is illustrated as a series connection of each of the plurality of LEDs 24. The second set 32 of LEDs 24 likewise includes a plurality of LEDs 24 connected to one another, which connection also is illustrated as a series connection of each of the plurality of LEDs 24. Each of the first set 30 and the second set 32 include a total of six LEDs 24 connected in series, labeled D1-D6 of the first set 30 and D7-D12 of the second set 32.

In some embodiments, fewer or additional LEDs 24 per set can be used, while maintaining a same number of LEDs and same number of each type of LED per set. In some embodiments, a known different number of LEDs of the same type can be included in different sets. In some embodiments, the plurality of LEDs can be arranged other than all in series, while maintaining an identical circuit arrangement of each set. In some embodiments, three or more sets of LEDs can be included, such as being parallel arranged.

Generally, the first set 30 of LEDs and the second set 32 of LEDs are electrically connected in parallel to one another via terminal connections 40 and 42 of each of the first and second sets 30 and 32 of LEDs. Individual LEDs 24 of one set are not otherwise connected to single LEDs 24 of the other set other than via the terminal connections 40 and 42. Multiplexing of the two sets 30 and 32 is not necessary, but can be used in other embodiments. Rather, between the respective terminal connections 40 and 42 of the first set 30 of LEDs, each individual LED 24 of the first set 30 is electrically separated from each individual LED 24 of the second set 32 of LEDs disposed between the respective terminal connections 40 and 42 of the second set 32 of LEDs, and vice versa.

For example, the first and second sets 30 and 32 are connected at one terminal end at a common anode 40 and have constant current sinks. At an opposite terminal end, each of the first and second sets 30 and 32 includes an individual or separated cathode 42. In some embodiments, the electrical arrangement of the illumination mechanism 16 can be suitably arranged such that the first and second sets 30 and 32 instead have a common cathode and constant current sources with separated anodes.

Provision of the sets 30 and 32 of LEDs in parallel and comparison between the sets 30 and 32 reduces or altogether eliminates issues caused by differences in inherent varying forward voltages of individual LEDs and differences in voltages measured at different environmental temperatures. By comparing voltages of the sets 30 and 32 which are arranged in parallel, differences in inherent varying forward voltages are averaged out by use of a plurality of LEDs per set. Likewise, variances in forward voltages due to environmental temperature changes are negated via allowing for a comparison of voltages of the sets, rather than evaluating a voltage measured at a single LED set, requiring in-depth understanding of the effect of temperature on respective LEDs.

The measuring and comparison of voltages at each of the sets 30 and 32 of LEDs is accomplished via the measurement circuitry 36, also herein referred to as a measurement circuit or measurement device, and the control circuitry 38, also herein referred to as a controller. While the illustrated measurement circuitry 36 is shown separate from the control circuitry 38, the measurement circuitry 36 and control circuitry 38 can be combined in other embodiments, such as being part of a single integrated element or circuit.

The measurement circuitry 36 is configured to measure a voltage of at least one of the sets 30 and 32. For example, the illustrated measurement circuitry 36 is configured to measure a voltage of each of the sets 30 and 32.

The measurement circuitry 36 can be configured to measure the voltages of the sets 30 and 32 simultaneously or consecutively.

In some embodiments, the measurement circuitry 36 can be configured to measure a current of at least one of the sets 30 and 32, such as to aid in determining whether an LED 24 has faulted open.

Generally, the measurement circuitry 36 is configured to measure the voltage at the same of the cathode terminal connection 42 or the anode terminal connection 40 of each of the sets 30 and 32 of LEDs. For example, the illustrated measurement circuitry 36 is arranged in the circuit with the sets 30 and 32, to measure an "output" voltage of each of the sets 30 and 32 at the individual cathode terminal connections 42. In other embodiments, the measurement circuitry 36 can be arranged in the circuit to measure voltage at each of the anode and cathode terminal connections 40 and 42, or to measure the voltage drop across each of the sets 30 and 32.

The measurement circuitry 36 can include any one or more suitable elements for measuring and/or comparing measured voltages of the sets 30 and 32 of LEDs, such as a comparator, null detector, digital logic gate, application specific integrated circuit, programmable logic device, analog-to digital converter, processor or memory, which list is not meant to be limiting. Where the measurement circuitry 36 includes a processor and memory, the memory can be provided for storing instructions, the instructions being executable by the processor to carry out measurement of voltages of each of the first and second sets 30 and 32 of LEDs.

The measurement circuitry 36 further is configured to communicate the results of the measuring with the control circuitry 38. Communication between the measurement circuitry 36 and the control circuitry 38 involves one or more output voltages being provided by the measurement circuitry 36, whether initiated by the measurement circuitry 36 or upon request by the control circuitry 38.

Communication between the measurement circuitry 36 and the control circuitry 38 can include an electrical signal being transferred wired or wirelessly, through any suitable communication connection, such as Wi-Fi, Ethernet, Bluetooth, token ring, Zigbee, CAN Bus, I2C, SPI, UART, etc.

Generally, the control circuitry 38 is configured to communicate with the measurement circuitry 36 and to analyze the output of the measurement circuitry 36, such as analyzing voltages measured by the measurement circuitry 36 and outputting a fault indication after the analysis. To provide these functions, the control circuitry 38 can include any suitable element or elements, such as a processor, memory, application specific integrated circuit or programmable logic device, which list is not meant to be limiting. Where the control circuitry 38 includes a processor and memory, the memory can be provided for storing instructions, the instructions being executable by the processor to carry out one or more analysis steps to be described herein.

In use, the control circuitry 38 is configured to output a fault indicator after analysis of the voltages measured by the measurement circuitry 36. The control circuitry 38 analyzes the voltages measured and at least discerns a difference between the measured voltages, which difference is indicative of a faulted LED, whether faulted short or open. A fault indicator is subsequently output, indicating that a difference, and particularly a non-zero difference, between the measured voltages was found. Accordingly, in the illustrated embodiment, where at least one LED 24 of one of the sets 30 and 32 of LEDs has faulted, a difference will be discerned between the voltages measured at the cathodes 42.

In some embodiments, the control circuitry 38 can be configured to output a fault indicator 44 where the difference is discerned as being at least one of less than a minimum predetermined voltage threshold or greater than a maximum predetermined voltage threshold. For example, the minimum predetermined voltage threshold can be a negative of the minimum forward voltage of an LED 24 and the maximum predetermined voltage can be a minimum forward voltage of an LED 24. In one example, where the difference is indicative of a minimum forward operating voltage of a single LED 24 of the sets 30 and 32 of LEDs, the difference is thus indicative of a faulted LED, and specifically a faulted short LED. The fault indicator can be a signal output to a display device 46 of the illumination mechanism.

In some embodiments, the control circuitry 38 is configured to output a fault indicator where an absolute value of a difference between the measured voltages is discerned as being greater than a predetermined voltage threshold. For example, the predetermined voltage threshold can be a minimum forward voltage of an LED 24. The control circuitry 38 can be configured to output an absolute value of the difference between the voltages measured.

The control circuitry 38 can be configured to analyze the voltages measured on demand by a user or can be configured to analyze the voltages upon completion of a certain event, such as at startup of the illumination mechanism 16. Alternatively, the control circuitry 38 can include a timing element and can be configured to analyze the voltages measured a predetermined number of times per time unit, such as once per second, or analysis can occur in conjunction with pulse-width-modulation of the sets 30 and 32, such as timed with startup.

The fault indicator output by the control circuitry 38 can be a signal transmitted to any of a display screen, an LED, a device outputting an audible signal, or another controller, any of which can be included as part of the illumination mechanism 16 or can be separate from the illumination mechanism 16. Transmission of the fault indicator can be wired or wireless, through any suitable communication connection, such as Wi-Fi, Ethernet, Bluetooth, token ring, Zigbee, CAN Bus, I2C, SPI, UART, etc.

In some embodiments, the measurement circuitry 36 and the control circuitry 38 can be integrated into a single element or circuit. In such case the combined control element/circuit will be configured to measure a voltage at each of the first set 30 and the second set 32, to at minimum determine whether there is a difference between the measured voltages, and to output a fault indicator where a difference is discerned.

In summary, an illumination mechanism 16 has a plurality of LEDs 24 for illuminating a surface 26 and the capability of determining whether one of the plurality of LEDs 24 has faulted. A pair of LED sets 30 and 32 is provided with the sets 30 and 32 electrically connected in parallel via terminal connections 40 and 42 of each set 30 and 32 of LEDs. Regardless of at least one of environmental temperature or minor differences in minimum forward voltages of individual LEDs 24, the illumination mechanism 16 is configured to discern whether at least a single LED 24 of one set of LEDs 24 of the pair has faulted. In instances where the sets 30 and 32 of LEDs are separated from a controller 38 or voltage measurement circuitry 36, the cost, circuit board real estate consumption, and manufacturing complexity associated with additional wiring and connections are minimized.

The present disclosure also provides a method of recognizing a faulted LED 24 of an LED mechanism 16 illuminating a surface 26. The method includes the step of (a) illuminating a surface 26 with a pair of sets 30 and 32 of LEDs 24 each including a same number of connected LEDs 24, with the sets 30 and 32 being electrically connected in parallel at terminal connections 40 and 42 of each of the sets 30 and 32 of LEDs in an arrangement preventing current from passing between the sets 30 and 32 of LEDs physically disposed between the terminal connections 40 and 42. The method further includes the steps of (b) powering the sets 30 and 32 of LEDs, (c) separately measuring a voltage at each of the sets 30 and 32 of LEDs, (d) comparing against one another the voltages measured at each of the sets 30 and 32 of LEDs, and (e) outputting a fault indicator where a difference is discerned between the voltages measured.

The method can include comparing the difference between the voltages measured against at least one of a minimum predetermined voltage threshold or a maximum predetermined voltage threshold and outputting a fault indicator where the difference is less than the minimum predetermined voltage threshold or greater than the maximum predetermined voltage threshold.

The method can include outputting a fault indicator where an absolute value of the difference is discerned as being greater than a predetermined voltage threshold.

Although the disclosed technology has been shown and described with respect to a certain embodiment or embodiments, it is obvious that equivalent alterations and modifications will occur to others skilled in the art upon the reading and understanding of this specification and the annexed drawings. While a feature of the disclosed technology may have been described above with respect to one or more certain illustrated embodiments, the feature may be combined with one or more other features of the other embodiments, as may be suitable for any given or particular application. Devices, processes, functions and methods that come within the meaning of that which is claimed, either literally or by equivalence, are intended to be embraced therein.

The invention claimed is:

1. An illumination mechanism, comprising:
   an optical sensor adapted to measure relative motion of a vehicle;
   a first set of light-emitting diodes (LEDs) and a second set of LEDs electrically connected in parallel to one another via terminal connections of each of the first and second sets of LEDs, wherein the first and second sets of LEDs are disposed equally and circumferentially about a lens of the optical sensor, and arranged to illuminate a ground surface;
   a power source arranged to power the first and second sets of LEDs;
   a voltage measuring circuitry arranged to separately measure a voltage at each of the first and second sets of LEDs; and
   a control circuitry in communication with the voltage measuring circuitry and configured to compare against one another the voltages measured at each of the first and second sets of LEDs and to output a fault indicator where a difference between the measured voltages is discerned as being at least one of less than a minimum predetermined voltage threshold or greater than a maximum predetermined voltage threshold, and
   wherein the minimum predetermined voltage threshold is a negative of a minimum forward voltage of an LED of the first set of LEDs or the second set of LEDs, and
   the maximum predetermined voltage is a minimum forward voltage of an LED of the first set of LEDs or the second set of LEDs.

2. The illumination mechanism of claim 1, wherein between the respective terminal connections of the first set of LEDs, each individual LED of the first set of LEDs is electrically separated from each individual LED of the second set of LEDs disposed between the respective terminal connections of the second set of LEDs; and
   wherein between the respective terminal connections of the second set of LEDs, each individual LED of the second set of LEDs is electrically separated from each individual LED of the first set of LEDs disposed between the respective terminal connections of the first set of LEDs.

3. The illumination mechanism of claim 1, wherein each of the first and second sets of LEDs have both a cathode terminal connection and an anode terminal connection, and wherein the voltage measuring circuitry is arranged to measure the voltage at the same of the cathode terminal connection or the anode terminal connection of each of the first and second sets of LEDs.

4. The illumination mechanism of claim 1, wherein the voltage that the voltage measuring circuitry is arranged to separately measure at each of the first and second sets of LEDs is the voltage drop across each of the first and second sets of LEDs.

5. The illumination mechanism of any claim 1, wherein the voltage measuring circuitry is configured to simultaneously measure the separate voltages at each of the first and second sets of LEDs.

6. The illumination mechanism of claim 1, wherein the control circuitry is configured to output the fault indicator where an absolute value of the difference is discerned as being greater than a predetermined voltage threshold.

7. The illumination mechanism of claim 1, wherein the fault indicator is a signal output to a display device of the illumination mechanism.

8. The illumination mechanism of claim 1, wherein the control circuitry is configured to further separately compare each of the voltages measured against at least one of the minimum predetermined voltage threshold or the maximum predetermined voltage threshold and to output a fault indicator indicating at least one of the first or the second sets of LEDs as having faulted.

9. The illumination mechanism of claim 1, wherein each of the first and the second sets of LEDs includes a same number of LEDs.

10. The illumination mechanism of claim 1, wherein each of the LEDs of the first set of LEDs are serially connected to one another, and wherein each of the LEDs of the second set of LEDs are serially connected to one another.

11. An illumination mechanism, comprising:
an optical sensor adapted to measure relative motion of a vehicle;
a pair of sets of light-emitting diodes (LEDs) each including a same number of connected LEDs, the sets of LEDs of the pair being electrically connected in a parallel and non-multiplexed arrangement to one another, wherein the first and second sets of LEDs are arranged to illuminate a ground surface;
a power source arranged to power the first and second sets of LEDs;
a voltage measuring circuitry arranged to separately measure a voltage at each of the sets of LEDs; and
a control circuitry in communication with the voltage measuring circuitry and configured to compare against one another the voltages measured at each of the sets of LEDs and to output a fault indicator where a difference between the voltages measured is discerned as being at least one of less than a minimum predetermined voltage threshold or greater than a maximum predetermined voltage threshold, and
wherein the minimum predetermined voltage threshold is a negative of a minimum forward voltage of an LED of the first set of LEDs or the second set of LEDs, and
the maximum predetermined voltage is a minimum forward voltage of an LED of the first set of LEDs or the second set of LEDs.

12. The illumination mechanism of claim 11, wherein each of the sets of LEDs have both a cathode terminal connection and an anode terminal connection, and wherein the voltage measuring circuitry is arranged to measure the voltage at the same of the cathode terminal connection or the anode terminal connection of each of the sets of LEDs.

13. The illumination mechanism of claim 11, wherein the voltage that the voltage measuring circuitry is arranged to separately measure at each of the sets of LEDs is the voltage drop across each of the sets of LEDs.

14. The illumination mechanism of claim 11, wherein the voltage measuring circuitry is configured to simultaneously measure the separate voltages at each of the sets of LEDs.

15. The illumination mechanism of claim 11, wherein each of the LEDs of the respective sets of LEDs are serially connected to one another.

16. A method of recognizing a faulted light-emitting diode (LED) of an LED mechanism illuminating a surface, the method comprising:
illuminating a ground surface with a pair of sets of LEDs each including a same number of connected LEDs, with the sets being electrically connected in parallel at terminal connections of each of the sets of LEDs in an arrangement preventing current from passing between the sets of LEDs physically disposed between the terminal connections;
powering the sets of LEDs;
separately measuring a voltage at each of the sets of LEDs;
comparing against one another the voltages measured at each of the sets of LEDs; and
outputting a fault indicator where a difference between the voltages measured is discerned as being at least one of less than a minimum predetermined voltage threshold or greater than a maximum predetermined voltage threshold, and
wherein the minimum predetermined voltage threshold is a negative of a minimum forward voltage of an LED of the first set of LEDs or the second set of LEDs, and
the maximum predetermined voltage is a minimum forward voltage of an LED of the first set of LEDs or the second set of LEDs.

17. The method of recognizing a faulted light-emitting diode (LED) of an LED mechanism illuminating a surface claim 16, comprising outputting a fault indicator where an absolute value of the difference is discerned as being greater than a maximum predetermined voltage threshold.

* * * * *